United States Patent
Higashitani et al.

(10) Patent No.: US 6,602,776 B1
(45) Date of Patent: Aug. 5, 2003

(54) METHOD AND SYSTEM FOR PROVIDING A POLYSILICON STRINGER MONITOR

(75) Inventors: Masaaki Higashitani, Sunnyvale, CA (US); Hao Fang, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/155,500

(22) Filed: May 23, 2002

Related U.S. Application Data

(62) Division of application No. 09/429,244, filed on Oct. 28, 1999, now Pat. No. 6,448,609.

(51) Int. Cl.[7] .............................................. H01L 21/44
(52) U.S. Cl. ...................... 438/612; 438/620; 438/266; 438/598; 438/257; 438/261
(58) Field of Search ................................. 438/612, 128, 438/275, 587, 598, 257, 266, 620, 261, 618, 631

(56) References Cited

U.S. PATENT DOCUMENTS

| | | | | | |
|---|---|---|---|---|---|
| 4,180,826 A | * | 12/1979 | Shappir | ...................... | 438/275 |
| 6,030,868 A | * | 2/2000 | Early et al. | .................. | 438/257 |
| 6,057,193 A | * | 5/2000 | Wag et al. | .................. | 438/266 |
| 6,266,264 B1 | * | 7/2001 | Proebsting | .................... | 365/63 |

* cited by examiner

*Primary Examiner*—Matthew Smith
*Assistant Examiner*—Igwe U. Anya
(74) *Attorney, Agent, or Firm*—Winstead Sechrest & Minick P.C.

(57) ABSTRACT

A system and method detecting the presence of polysilicon stringers on a memory array using a polysilicon stringer monitor. The polysilicon stringer monitor includes a continuous type-2 layer of polysilicon forming a first row and a second row across the active region and covering the active region in-between the first and second rows. The polysilicon stringer monitor further includes a continuous type-1 layer of polysilicon extending under the first row, wherein the type-1 layer also covers the active area in-between the first and second rows as well as covers the active area under the second row.

2 Claims, 6 Drawing Sheets

METHOD AND SYSTEM FOR PROVIDING A POLYSILICON STRINGER MONITOR

CROSS-REFERENCE TO RELATED APPLICATIONS

The present application is a divisional of U.S. Ser. No. 09/429,244, filed Oct. 28, 1999, now U.S. Pat. No. 6,448,609, and assigned of record to Advanced Micro Devices, Inc., of Sunnyvale, Calif.

FIELD OF THE INVENTION

The present invention relates to memory arrays, and more particularly to a method and system for providing a polysilicon stringer monitor.

BACKGROUND OF THE INVENTION

Achieving higher yields continues to be a desired goal during memory chip fabrication. The various processes and techniques used to manufacture chips have therefore become increasingly important. Part of the process involved in manufacturing a flash memory array, for example, requires creating an array of CMOS (Complementary MOS) transistors using layers of polysilicon.

The flash memory array includes columns of active regions that are separated by columns of insulating field oxide regions. The transistors are spaced apart in the active regions and each a row of transistors are bits in a memory word. The transistors are formed with various materials including a type-1 layer of polysilicon, and transistors forming a row in the array are connected by a word-line comprising a type-2 layer of polysilicon.

FIGS. 1–4 are diagrams illustrating the process of creating such a memory array. FIG. 1A is a top view of a portion of a substrate 10 and FIG. 1B is a cross-sectional view of the substrate 10 along line A. The first step of the process is creating the columns of active regions 12 and insulating field oxide regions (FOX) 14.

FIGS. 2A and 2B are top and cross-sectional views of the substrate 10, respectively, showing that a layer of tunnel oxide 16 is then deposited over the active regions 12 followed by the deposition of a type-1 layer of polysilicon 18, which is referred to as a poly1 layer. The poly1 layer 18 is then masked and etched as shown.

FIG. 3A is a top view of the substrate 10 showing that a layer of oxide nitride (ONO) 20 is then deposited over the poly1 layer 18, and that a type-2 layer of polysilicon 22 (poly2 ) is patterned over the ONO 20 to form word lines. FIG. 3B is a cross-sectional view of the substrate 10 along line B, and FIG. 3B is a cross-sectional view of the substrate 10 along line C.

In FIG. 4A, after the poly2 layer is deposited, an etch is performed on the ONO 20 and the poly1 layer 18 between the rows of the poly2 layer 22, which is also shown in the cross-sectional view of FIG. 4B.

FIG. 4C is a cross-sectional perspective view of the substrate along line E after the etching of the ONO 20 and the poly1 layer 18. The etching process is anisotropic, meaning that it removes material directionally to a predetermined depth. But due to the shape of the FOX regions 14, the thickness of the ONO 20 and the poly1 layer 18 at the vertical edges of the poly1 layer 18 is greater than their average thicknesses. Therefore, the etching process sometimes fails to remove all of the ONO 20 and the poly1 18 from the active regions 12 between the rows of poly2 22, leaving what is called a poly1 stringer 26. The presence of a poly1 stringer 26 provides a contact between the two adjacent transistors, which causes problems in the memory array.

Accordingly, what is needed is a system and method for detecting the presence of poly1 stringers on a memory array. The present invention addresses such a need.

SUMMARY OF THE INVENTION

The present invention provides a system and method for detecting the presence of poly1 stringers on a memory array. The polysilicon stringer monitor includes a continuous type-2 layer of polysilicon forming a first row and a second row across the active region and covering the active region in-between the first and second rows. The polysilicon stringer monitor further includes a continuous type-1 layer of polysilicon extending under the first row, wherein the type-1 layer also covers the active area in-between the first and second rows as well as covers the active area under the second row.

According to the present invention, extending the type-1 and type-2 layers of polysilicon in this manner effectively enables the detection of poly1 stringers in the active areas of the memory array.

DETAILED DESCRIPTION

The present invention relates to the detection of type-1 polysilicon stringers along the active region of a memory array between two transistor areas. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention provides a poly1 stringer monitor that is capable of detecting poly 1 stringers along the active region of a memory array between two transistor areas. The poly1 stringer monitor comprises a continuous layer of type-2 polysilicon that extends along word lines and along the active region in-between each pair of word lines. The poly1 stringer monitor also includes a continuous layer of type-1 polysilicon that extends under one word line in a pair, over the active area in-between the pair of word lines, and extends over the active region under the second word line in the pair.

Figure 5:
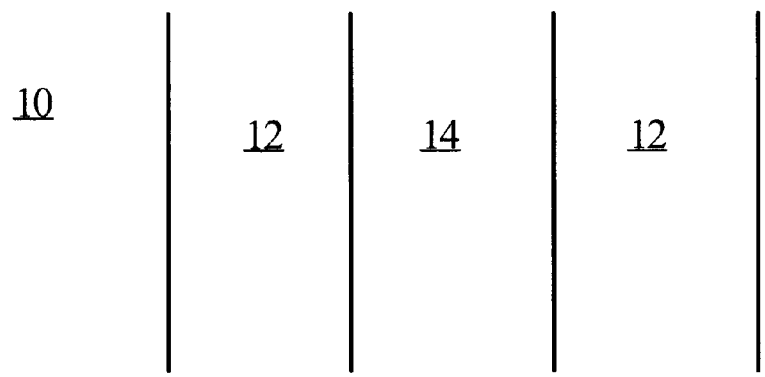
FIG. 5 is a top view of the substrate illustrating the beginning of the process for creating a poly 1 stinger monitor in accordance with the present invention.

To more particularly describe the present invention, refer now to FIG. 5- illustrating the process of creating the poly 1 stringer monitor in accordance with the present invention.

FIG. 5 is a top view of the substrate illustrating that the process for creating the poly 1 stringer monitor begins with creating active regions 12 and insulating FOX regions 14.

Figure 6:
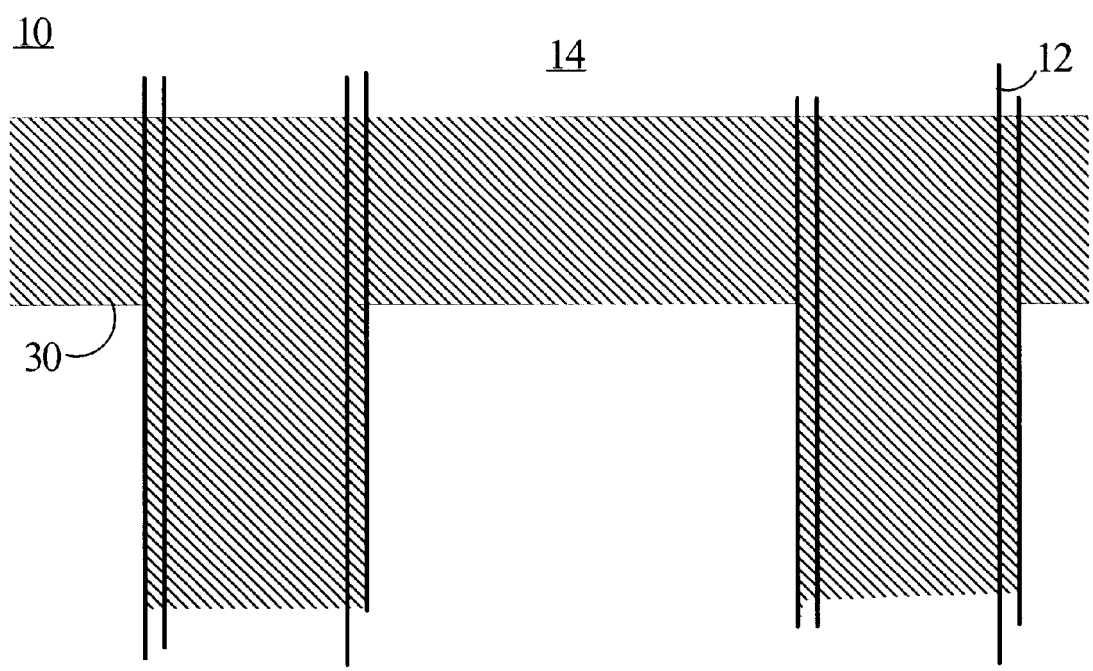
FIG. 6 is a top view of the substrate showing a continuous poly1 layer over the active region.

FIG. 6 is a top view of the substrate showing that after formation of the active regions 12, a tunnel oxide layer (not shown) and a poly1 layer 30 are deposited and etched over the active region 12. As, shown, the tunnel oxide layer and the poly1 30 are etched such that the tunnel oxide layer and the poly1 30 also cover the area of the substrate where a word line will be located.

Figure 7A:
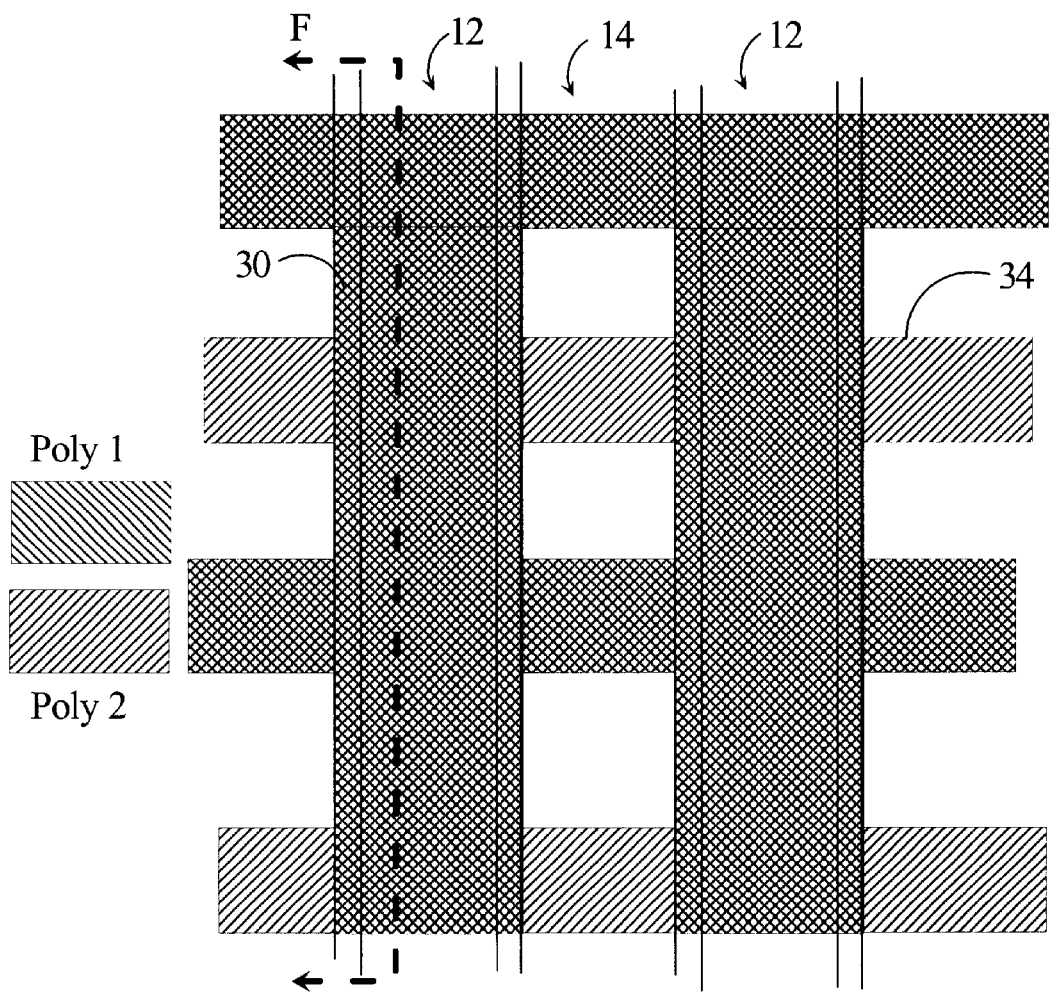
FIG. 7A is a top view of the substrate 10 showing a continuous layer of poly2 .
Figure 7B:
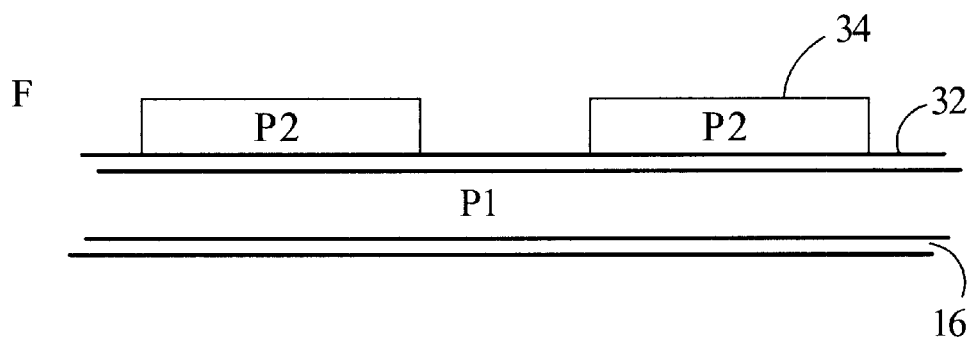
FIG. 7B is a cross-sectional view of the substrate along line F showing the width of the connected poly2 layer over the poly1 layer.

FIGS. 7A is a top view of the substrate 10 and FIG. 7B is a cross-sectional view of the substrate 10 along line F. After the poly1 layer 30 is etched, a layer of oxide nitride (ONO) 32 is then deposited over the poly1 30 followed by a type-2 layer of polysilicon 34 (poly2 ) to form the word lines. The ONO 32 and the poly2 are etched such that the ONO 32 and the poly2 34 extend between each pair of word lines over the active area 12. This effectively connects the poly2 lines 34 over the active regions 12 between two transistor areas.

Figure 1A:
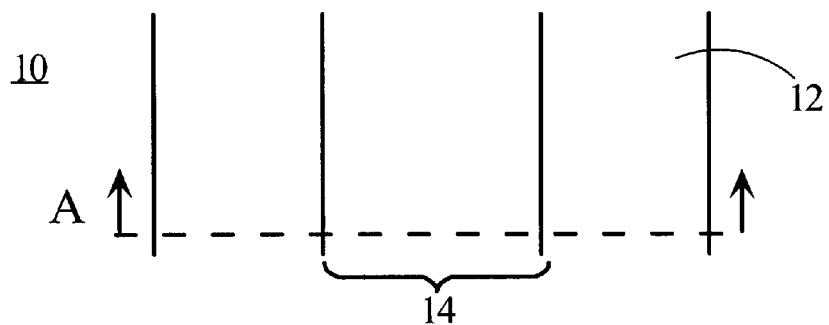
FIG. 1A is a top view of a portion of a substrate.
Figure 1B:
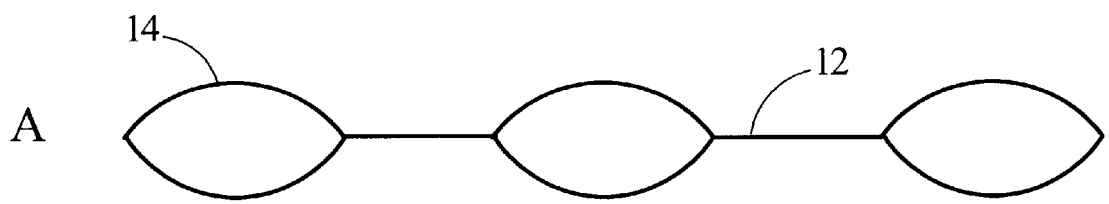
FIG. 1B is a cross-sectional view of the substrate along line A.
Figure 2A:
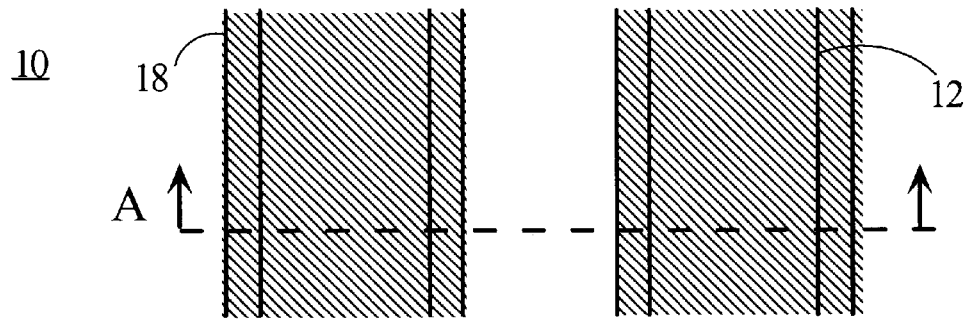
FIGS. 2A and 2B are top and cross-sectional views of the substrate along line .
Figure 2B:
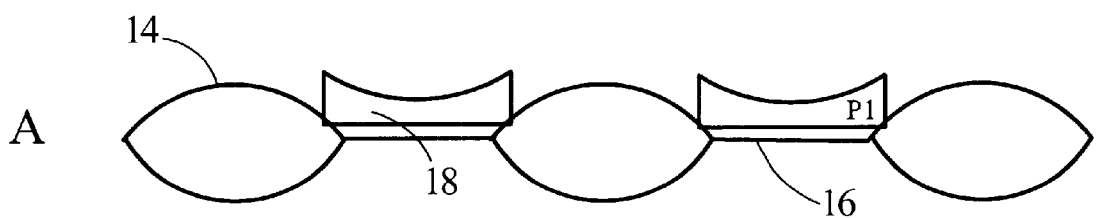
Figure 3A:
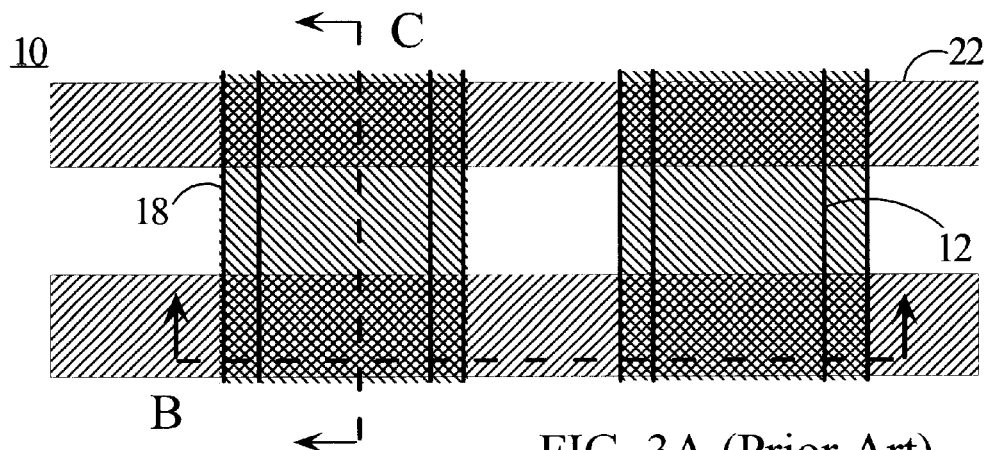
FIG. 3A is a top view of the substrate showing the deposition of poly1 layer.
Figure 3B:
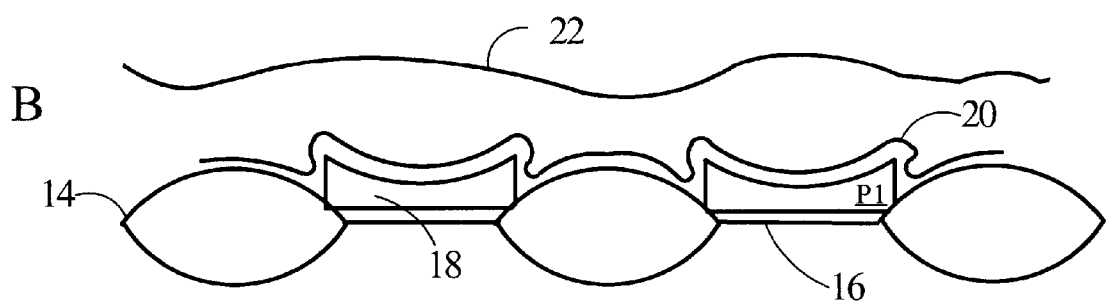
FIG. 3B is a cross-sectional view of the substrate along line B.
Figure 3C:
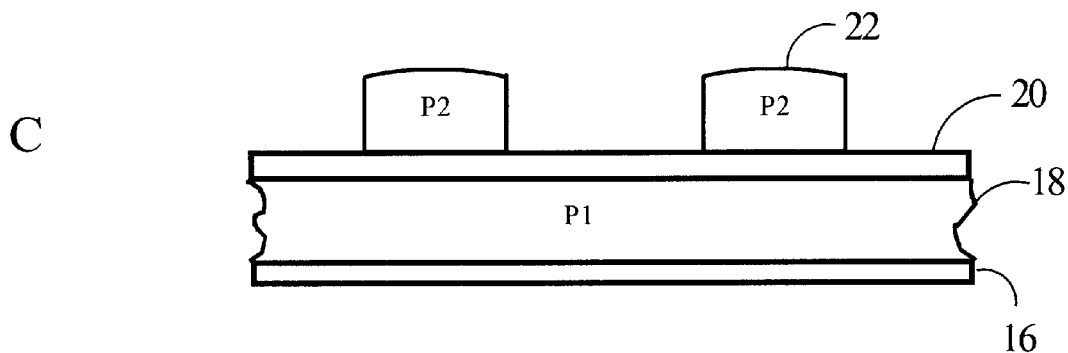
FIG. 3C is a cross-sectional view of the substrate along line C.
Figure 4A:
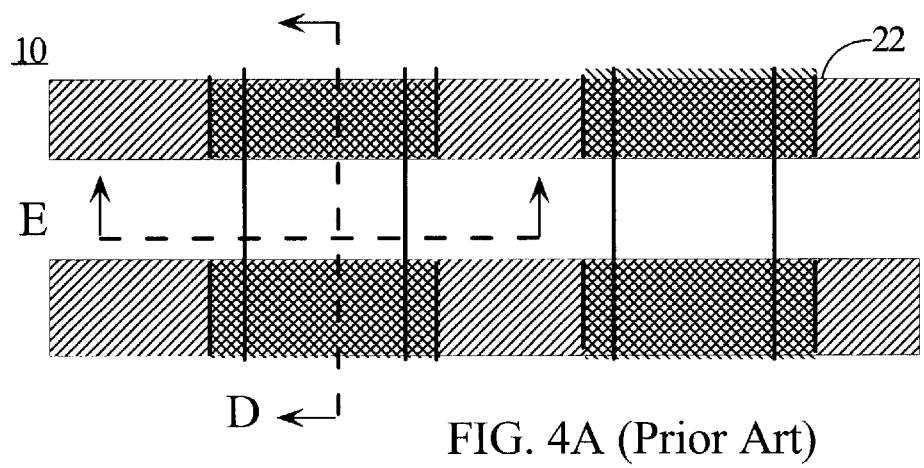
FIG. 4A is a top view of the substrate showing the etching of the poly1 layer between the rows of a poly2 layer
Figure 4B:
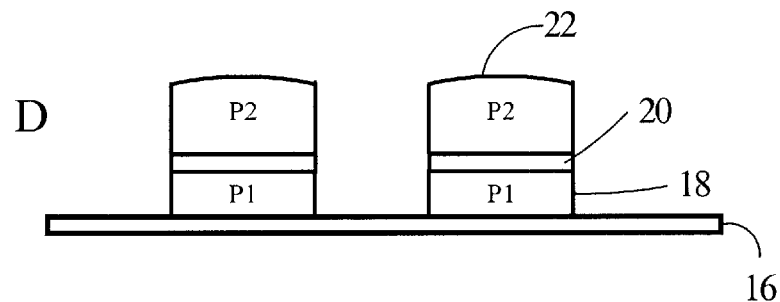
FIG. 4B is a cross-section view of the substrate along line D.
Figure 4C:
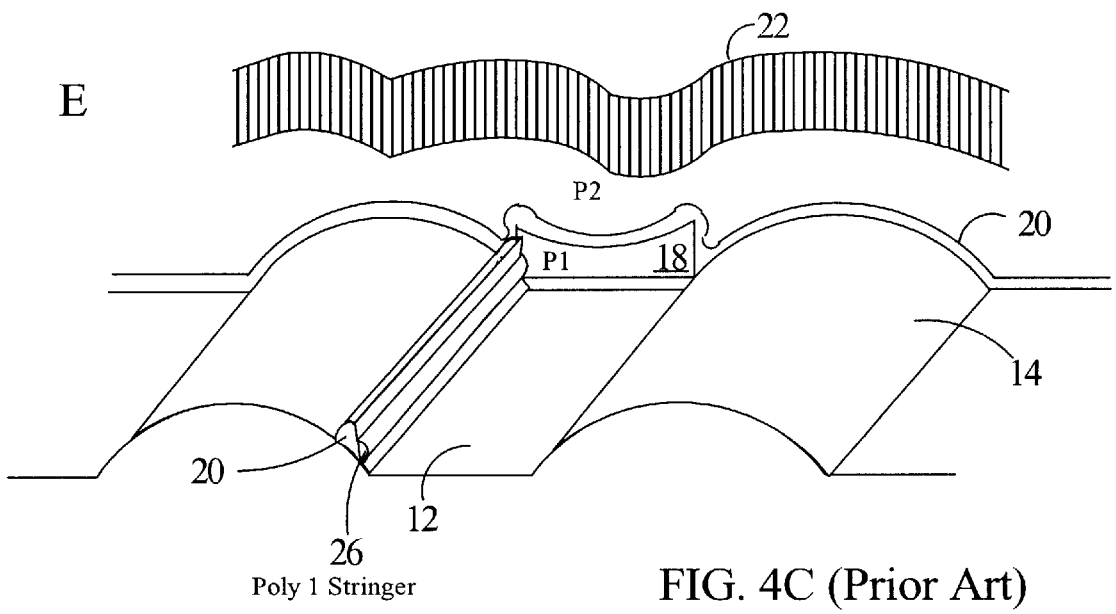
FIG. 4C is a cross-sectional perspective view of the substrate along line E after the etching the poly1 layer.
Figure 8A:
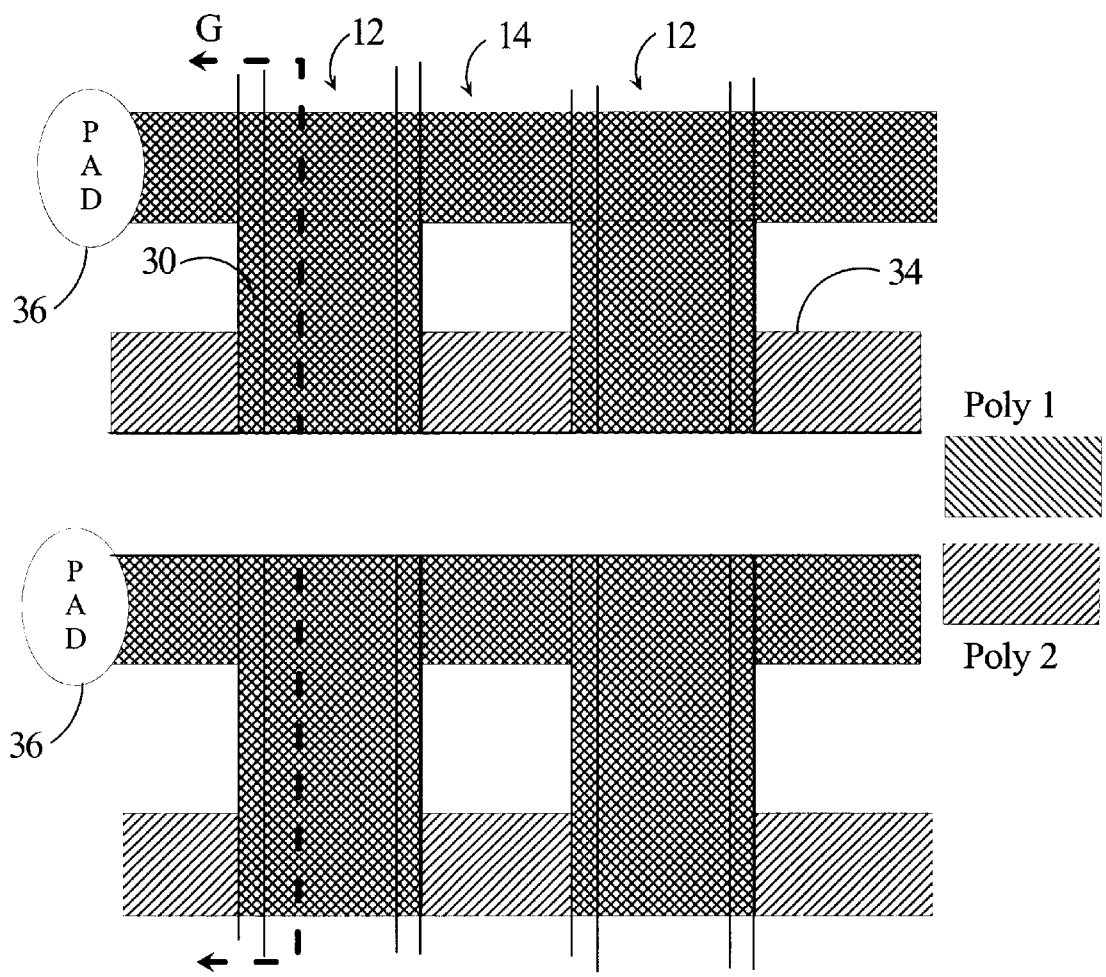
FIG. 8A is a top view of the substrate showing the poly1 stringer monitor of the present invention.
Figure 8B:
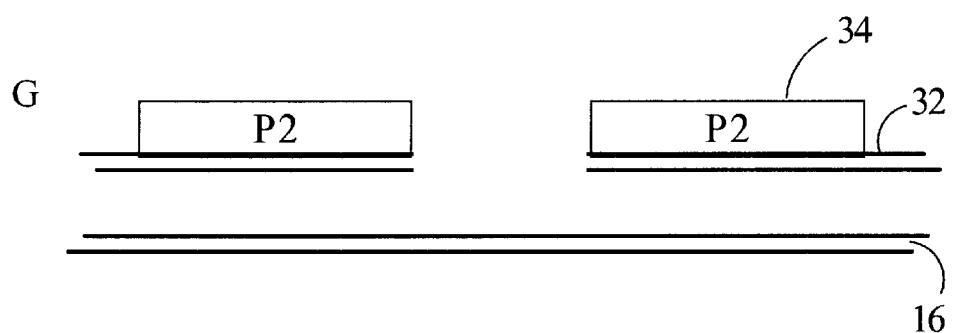
FIG. 8B is a cross-sectional view of the substrate along line G.

In FIG. 8A, after the poly2 layer 34 is deposited, an etch is performed on the ONO 32 and the poly1 layer 30 outside each pair of word lines over the active area 12, which is also shown in the cross-sectional view of FIG. 4B, to provide the poly 1 stringer monitor of the present invention.

For each pair of word lines in the poly 1 stringer monitor, one of the word lines in the pair will include a layer of poly1 30. Each word line poly 1 stringer monitor having a layer of poly1 30 is then connected to an external pad 36 so that any poly1 stringers present on the memory array may be detected.

A method and system for providing a poly 1 stringer monitor has been disclosed. Although the present invention has been described in accordance with the embodiments shown, one of ordinary skill in the art will readily recognize that there could be variations to the embodiments and those variations would be within the spirit and scope of the present invention. Accordingly, many modifications may be made by one or ordinary skill in the art without departing from the spirit and scope of the appended claims.

What is claimed is:

1. A method for creating a poly 1 stringer monitor, comprising the steps of:
    (a) creating active regions over a substrate;
    (b) patterning a poly1 layer over the active region such that the poly1 layer also covers the area of the substrate where one word line in a pair of word lines will be located;
    (c) patterning a continuous poly2 layer over the substrate to form the word lines such that the poly2 layer extends between each pair of word lines over the active area;
    (d) etching the poly1 layer outside each pair of word lines over the active area; and for each pair of word lines, connecting the word line having a layer of poly1 to an external pad so that any poly1 stringers that occur after etching may be detected.

2. The method of claim 1 wherein step (c) includes the step of patterning the poly2 over the active region such that the poly 2 connects lines two transistor areas.

* * * * *